US012132069B2

(12) United States Patent
Asada et al.

(10) Patent No.: US 12,132,069 B2
(45) Date of Patent: Oct. 29, 2024

(54) DISPLAY DEVICE

(71) Applicant: Japan Display Inc., Tokyo (JP)

(72) Inventors: Keisuke Asada, Tokyo (JP); Kazuyuki Yamada, Tokyo (JP); Kenichi Takemasa, Tokyo (JP)

(73) Assignee: Japan Display Inc., Tokyo (JP)

( * ) Notice: Subject to any disclaimer, the term of this patent is extended or adjusted under 35 U.S.C. 154(b) by 431 days.

(21) Appl. No.: 17/346,466

(22) Filed: Jun. 14, 2021

(65) Prior Publication Data

US 2021/0391381 A1 Dec. 16, 2021

(30) Foreign Application Priority Data

Jun. 15, 2020 (JP) ................................. 2020-103083

(51) Int. Cl.
| | | |
|---|---|---|
| *H01L 33/56* | (2010.01) | |
| *H01L 25/075* | (2006.01) | |
| *H01L 27/15* | (2006.01) | |
| *H01L 33/38* | (2010.01) | |
| *H01L 33/42* | (2010.01) | |
| *H01L 33/54* | (2010.01) | |
| *H01L 33/62* | (2010.01) | |

(52) U.S. Cl.
CPC .......... *H01L 27/156* (2013.01); *H01L 33/382* (2013.01); *H01L 33/42* (2013.01); *H01L 33/54* (2013.01); *H01L 33/56* (2013.01); *H01L 33/62* (2013.01)

(58) Field of Classification Search
CPC ..... H01L 27/153; H01L 27/156; H01L 33/42; H01L 33/56; H10K 77/10–111; H10K 77/311; H10K 56/844; H10K 56/8445; H10K 56/873; H10K 56/8731; H10K 2102/311; G09G 2380/02
See application file for complete search history.

(56) References Cited

U.S. PATENT DOCUMENTS

| | | | |
|---|---|---|---|
| 10,325,889 B1 | 1/2019 | Chen | |
| 2016/0028043 A1* | 1/2016 | Kwon | .................. H10K 50/844 257/40 |
| 2017/0176827 A1* | 6/2017 | Kawata | ............. G02F 1/133345 |
| 2018/0183015 A1* | 6/2018 | Yun | ........................ H10K 71/80 |

(Continued)

FOREIGN PATENT DOCUMENTS

| | | |
|---|---|---|
| JP | 2019-212694 A | 12/2019 |
| WO | WO-2020189047 A1 * | 9/2020 ........... H01L 27/156 |

OTHER PUBLICATIONS

Office Action issued on Jan. 30, 2024, in corresponding Japanese Application No. 2020-103083, 9 pages.

*Primary Examiner* — Walter H Swanson
*Assistant Examiner* — Jacob T Nelson
(74) *Attorney, Agent, or Firm* — Maier & Maier, PLLC

(57) ABSTRACT

According to one embodiment, a display device includes a substrate, a plurality of pixels, a resin layer and a common electrode. The pixels include a plurality of light emitting elements arranged on the substrate and having luminous colors different from each other, respectively. The resin layer is buried in a clearance part between the plurality of light emitting elements provided in each of the pixels. The common electrode is formed of a transparent conductive material covering the resin layer. The resin layer is provided in an island-like shape in each of the pixels.

12 Claims, 11 Drawing Sheets

(56) References Cited

U.S. PATENT DOCUMENTS

| | | | |
|---|---|---|---|
| 2018/0323116 A1* | 11/2018 | Wu | H01L 25/0753 |
| 2019/0075633 A1 | 3/2019 | Tsai et al. | |
| 2019/0157512 A1 | 5/2019 | Jung et al. | |
| 2019/0326547 A1* | 10/2019 | Yamamoto | H10K 50/82 |
| 2020/0136068 A1* | 4/2020 | Lee | H10K 59/124 |
| 2021/0082892 A1 | 3/2021 | Kanaya et al. | |

\* cited by examiner

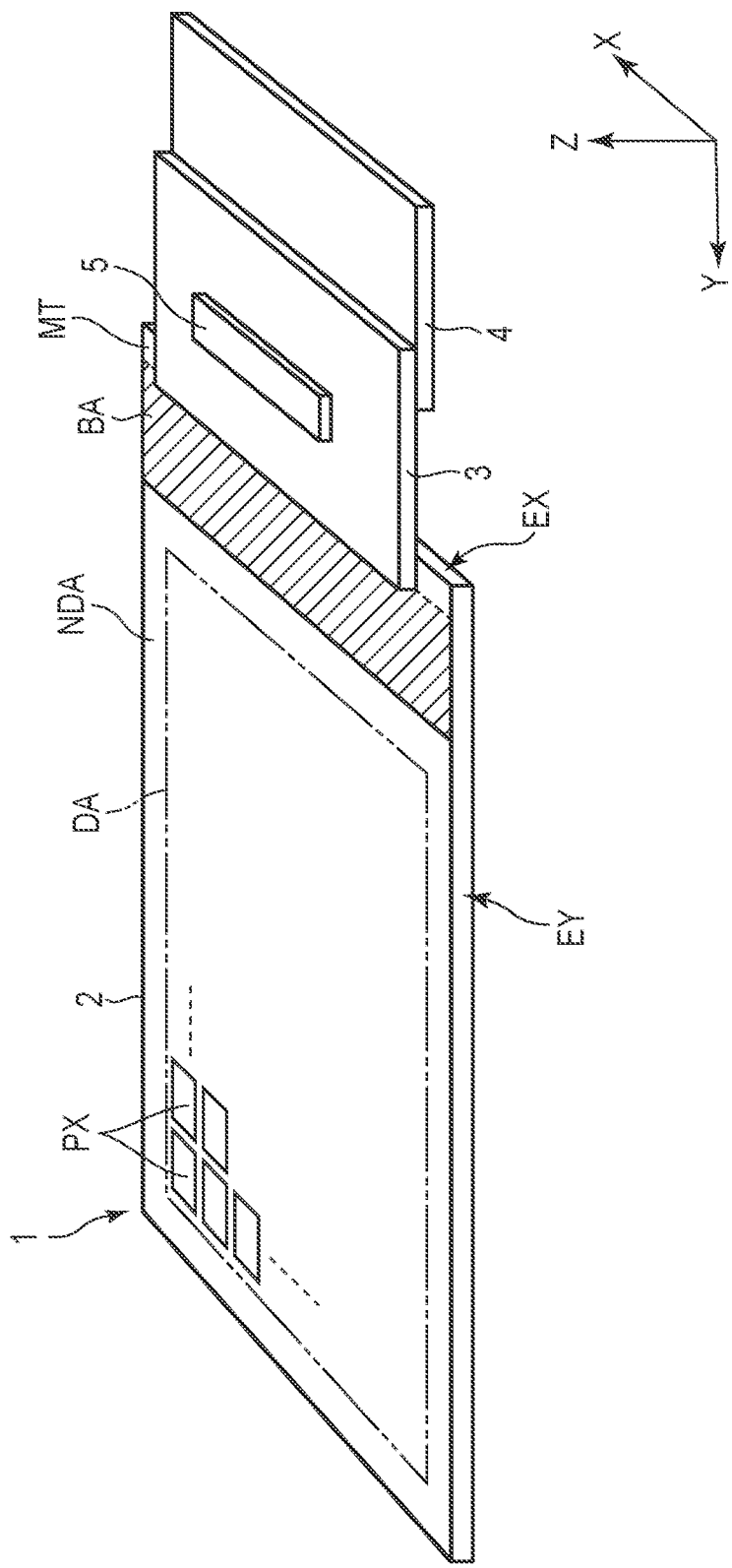
F I G. 1

DISPLAY DEVICE

CROSS-REFERENCE TO RELATED APPLICATIONS

This application is based upon and claims the benefit of priority from Japanese Patent Application No. 2020-103083, filed Jun. 15, 2020, the entire contents of which are incorporated herein by reference.

FIELD

Embodiments described herein relate generally to a display device.

BACKGROUND

Generally, an LED display using the light-emitting diode (LED) which is a spontaneous light-emitting element is known but, recently, a display device (hereinafter referred to as a micro-LED display) using a minute diode element referred to as a micro-LED has been developed.

Since a number of chip-shaped micro-LEDs are mounted in a display area, unlike a conventional liquid crystal display or organic EL display, the micro-LED display can easily achieve both high definition and upsizing and is focused as a next generation display.

The micro-LED comprises an emitting layer which emits light and upper and lower electrodes arranged on upper and lower sides of the emitting layer to have the emitting layer sandwiched therebetween. The upper and lower electrodes of the micro-LED, and a drive circuit formed on a substrate of the micro-LED display are electrically connected via electrodes arranged on respective upper and lower sides of the upper and lower electrodes. According to members configuring the micro-LED display, however, an internal stress may concentrate on a coherent interface between the upper and lower electrode of the micro-LED and the electrodes arranged on the respective upper and lower sides of the upper and lower electrodes. According to this, the electrodes arranged on the respective upper and lower sides of the upper and lower electrodes of the micro-LED may be peeled off from the upper and lower electrodes and broken.

BRIEF DESCRIPTION OF THE DRAWINGS

FIG. 1 is a perspective view schematically showing a structure of a display device according to the embodiment.

DETAILED DESCRIPTION

Figure 2:
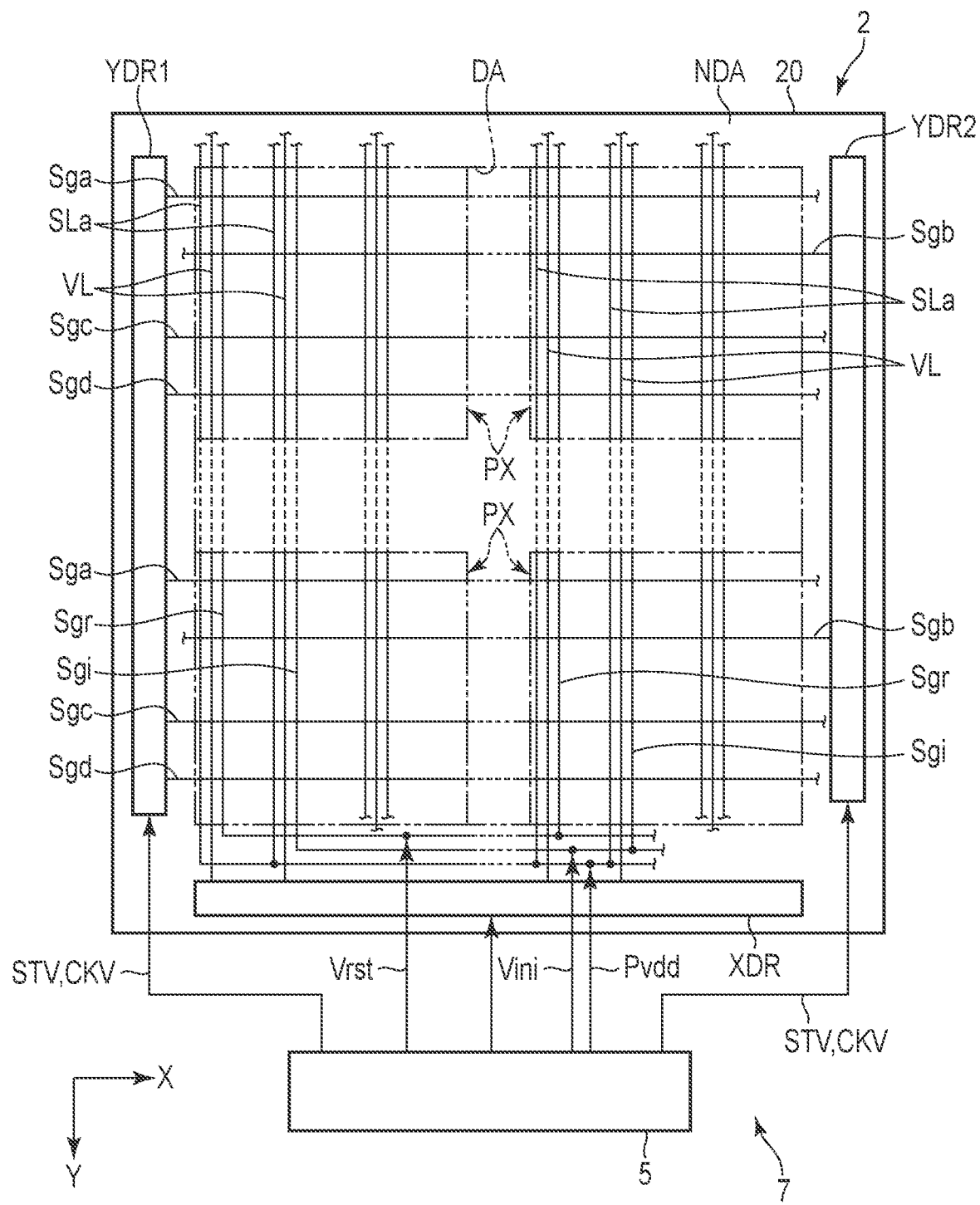
FIG. 2 is a diagram schematically showing a circuit configuration of the display device according to the embodiment.

In general, according to one embodiment, a display device comprises a substrate, a plurality of pixels, a resin layer and a common electrode. The pixels comprise a plurality of light emitting elements arranged on the substrate and having luminous colors different from each other, respectively. The resin layer is buried in a clearance part between the plurality of light emitting elements provided in each of the pixels. The common electrode is formed of a transparent conductive material covering the resin layer. The resin layer is provided in an island-like shape in each of the pixels.

According to another embodiment, a display device comprises an insulating base, a first organic insulating layer provided on the insulating base, a second organic insulating layer provided on the first organic insulating layer, a resin layer provided on the second organic insulating layer, a common electrode provided on the resin layer and a plurality of pixels. The pixels comprise a plurality of light emitting elements arranged between the second organic insulating layer and the common electrode and surrounded by the resin layer, respectively. The common electrode is in contact with the second organic insulating layer between two adjacent pixels.

Various embodiments will be described hereinafter with reference to accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

FIG. 1 is a perspective view schematically showing a configuration of a display device 1 according to one of the embodiments. FIG. 1 shows a three-dimensional space defined by a first axis X, a second axis Y perpendicular to the first axis X, and a third axis Z perpendicular to the first axis X and the second axis Y. Incidentally, the first direction X and the second direction Y are orthogonal to each other, but may intersect at an angle other than 90 degrees. In the present specification, viewing the display device 1 from a direction parallel to the third direction Z is referred to as planar view.

An example in which the display device 1 is a micro-LED display using the micro-LED which is the spontaneous light-emitting element in the embodiment will be described below.

As shown in FIG. 1, the display device 1 comprises a display panel 2, a first circuit board 3, a second circuit board 4, and the like.

The display panel 2 has, for example, a rectangular shape. In the example illustrated, shorter sides EX of the display panel 2 are parallel to the first direction X and longer sides EY of the display panel 2 are parallel to the second direction Y. The third direction Z corresponds to a thickness direction of the display panel 2. The first direction X may be restated as a direction parallel to the shorter sides of the display device 1, the second direction Y may be restated as a direction parallel to the longer sides of the display device 1, and the third direction Z may be restated as a thickness direction of the display device 1. The main surface of the display panel 2 is parallel to an X-Y plane defined by the first direction X and the second direction Y. The display panel 2 includes a display area DA (display part) and a non-display area NDA (non-display part) located outside the display area DA. The non-display area NDA includes a terminal area MT. In the example illustrated, the non-display area NDA surrounds the display area DA.

The display area DA is an area for displaying an image and includes, for example, a plurality of pixels PX arrayed in a matrix. The pixel PX includes a light emitting element (micro-LED), a switching element (drive transistor) for driving the light emitting element, and the like.

The terminal area MT is provided along the shorter sides EX of the display panel 2 and includes a terminal which electrically connects the display panel 2 with an external device or the like.

The first circuit board 3 is mounted on the terminal area MT and is electrically connected to the display panel 2. The first circuit board 3 is, for example, a flexible printed circuit board. The first circuit board 3 comprises a driver IC chip (hereinafter referred to as a panel driver) 5 which drives the display panel 2, and the like. Incidentally, in the example illustrated, the panel driver 5 is arranged on the first circuit board 3, but may be arranged under the first circuit board 3. Alternatively, panel driver 5 may be mounted on a part other than the first circuit board 3. In this case, the panel driver 5 may be mounted on the non-display area NDA of the display panel 2 or may be mounted on the second circuit board 4. The second circuit board 4 is, for example, a rigid printed circuit board. For example, the second circuit board 4 is connected to the first circuit board 3 at a position under the first circuit board 3.

For example, the panel driver 5 is connected to a control board (not shown) via the second circuit board 4. For example, the panel driver 5 executes control of displaying an image on the display panel 2 by driving a plurality of pixels PX, based on a video signal output from the control board.

Incidentally, the display panel 2 may include a bending area BA represented by hatch lines. The bending area BA is an area which is bent when the display device 1 is accommodated in a housing of an electronic apparatus or the like. The bending area BA is located on the terminal area MT side of the non-display area NDA. In a state in which the bending area BA is bent, the first circuit board 3 and the second circuit board 4 are arranged to be opposed to the display panel 2.

Figure 3:
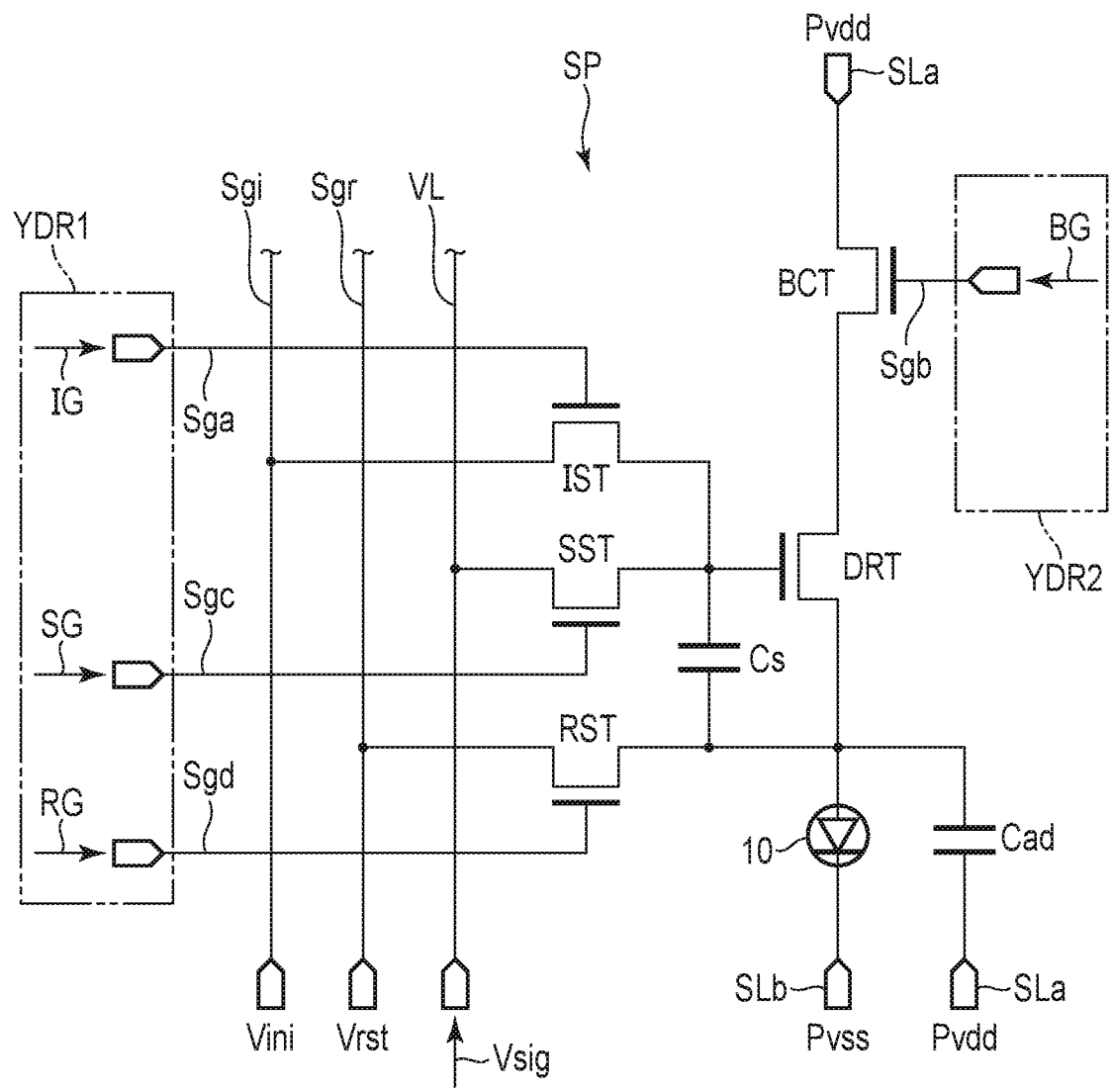
FIG. 3 is an equivalent circuit diagram schematically showing a sub-pixel according to the embodiment.

FIG. 2 is a plan view showing a circuit configuration of the display device 1. The FIG. 3 is an equivalent circuit diagram showing a sub-pixel SP included in the pixel PX. Incidentally, in FIG. 2, all of various lines are not shown, but are partially omitted for convenience.

As shown in FIG. 2 and FIG. 3, the display panel 2 comprises an insulating base (insulating substrate) 20 having a light transmitting property, a plurality of pixels PX arranged in a matrix on the insulating base 20 in the display area DA, various types of lines, scanning line drive circuits YDR1 and YDR2, a signal line drive circuit XDR, and the like.

Various types of lines include a plurality of first scanning lines Sga, a plurality of second scanning lines Sgb, a plurality of third scanning lines Sgc, a plurality of fourth scanning lines Sgd, a plurality of video signal lines VL, a plurality of first power lines SLa, a plurality of reset lines Sgr, and a plurality of initialization lines Sgi.

In the embodiment, the first scanning lines Sga, the third scanning lines Sgc, and the fourth scanning lines Sgd are connected to the scanning line drive circuit YDR1 and are provided to extend in the first direction X. The second scanning lines Sgb are connected to the scanning line drive circuit YDR2 and are provided to extend in the first direction X. The video signal lines VL are connected to the signal line drive circuit XDR and are provided to extend in the second direction Y. The first power lines SLa, the reset lines Sgr, and the initialization lines Sgi are provided to extend in the second direction Y.

For example, the plurality of first power lines SLa are located in the display area DA and spaced apart and arranged along the first direction X. The display panel 2 is provided with not only the first power lines SLa, but also a second power line SLb set at a potential different from the first power lines SLa. In the embodiment, the first power lines SLa are high potential power lines fixed at a high potential Pvdd, and the second power line SLb is a low potential power line fixed at a low potential Pvss. The first power lines SLa are connected to a high potential power supply, and the second power line SLb is connected to a low potential power supply.

The scanning line drive circuit YDR1 is configured to drive the first scanning lines Sga, the third scanning lines Sgc, and the fourth scanning lines Sgd. The scanning line drive circuit YDR2 is configured to drive the second scanning lines Sgb. The signal line drive circuit XDR is configured to drive the video signal line VL. The scanning line drive circuits YDR1 and YDR2 and the signal line drive circuit XDR are formed on the insulating base 20 in the non-display area NDA and configures a drive unit 7 together with the panel driver 5.

Each of the pixels PX is provided with a plurality of sub-pixels SP. Each of the sub-pixels SP includes a light emitting element 10 and a pixel circuit that supplies a drive current to the light emitting element 10. The light emitting element 10 is, for example, a spontaneous light-emitting element, and is a micro-LED in the embodiment. The display device 1 of the embodiment is a micro-LED display.

The pixel circuit of each of the sub-pixels SP is a voltage signal type pixel circuit that controls the light emission of the light emitting element 10 in accordance with the video signal Vsig formed of a voltage signal, and includes a reset switch RST, a pixel switch SST, an initialization switch IST, an output switch BCT, a drive transistor DRT, a storage capacitor Cs, and an auxiliary capacitor Cad. The storage capacitor Cs and the auxiliary capacitor Cad are the capacitors. The auxiliary capacitor Cad is an element provided to adjust the amount of a light emission current and may be unnecessary in some cases.

The reset switch RST, the pixel switch SST, the initialization switch IST, the output switch BCT, and the drive transistor DRT are composed of thin-film transistors (TFTs). In the embodiment, the reset switch RST, the pixel switch SST, the initialization switch IST, the output switch BCT, and the drive transistor DRT are configured by TFTs of the same conductivity type, for example, N-channel type. Incidentally, the reset switch RST, the pixel switch SST, the initialization switch IST, the output switch BCT, and the drive transistor DRT may be configured by P-channel TFTs. In this case, N-channel TFTs and P-channel TFTs may be formed at the same time. The reset switch RST, the pixel switch SST, the initialization switch IST, and the output switch BCT need only to function as switches, and do not need to be configured by TFTs.

In the display device 1 according to the embodiment, all the TFTs configuring the drive transistor DRT and the switches are top-gate thin film transistors formed to have the same structure through the same processes and using polycrystalline silicon for semiconductor layers. Incidentally, the semiconductor layers may use a semiconductor other than polycrystalline silicon, such as amorphous silicon or an oxide semiconductor.

Each of the reset switch RST, the pixel switch SST, the initialization switch IST, the output switch BCT, and the drive transistor DRT includes a first terminal, a second terminal, and a control terminal. In the embodiment, the first terminal is referred to as a source electrode, the second terminal is referred to as a drain electrode, and the control terminal is referred to as a gate electrode.

In the pixel circuit of the pixel PX, the drive transistor DRT and the output switch BCT are connected in series with the light emitting element 10 at positions between the first power line SLa and the second power line SLb. The first power line SLa (high potential Pvdd) is set to a potential of, for example, 10V and the second power line SLb (low potential Pvss) is set to a potential of, for example, 1.5V.

In the output switch BCT, a drain electrode is connected to the first power line SLa, a source electrode is connected to the drain electrode of the drive transistor DRT, and a gate electrode is connected to the second scanning line Sgb. The output switch BCT is thereby controlled to be on (conductive state) or off (non-conductive state) by a control signal BG supplied to the second scanning line Sgb. The output switch BCT controls the light emission time of the light emitting element 10 in response to the control signal BG.

In the drive transistor DRT, the drain electrode is connected to the source electrode of the output switch BCT, and a source electrode is connected to either of electrodes (in this example, an anode) of the light emitting element 10. The other electrode (in this example, a cathode) of the light emitting element 10 is connected to the second power line SLb. The drive transistor DRT outputs a drive current having a current amount corresponding to the video signal Vsig to the light emitting element 10.

In the pixel switch SST, a source electrode is connected to the video signal line VL, a drain electrode is connected to the gate electrode of the drive transistor DRT, and a gate electrode is connected to the third scanning line Sgc that functions as a gate line for signal write control. The pixel switch SST is controlled to be on and off by a control signal SG supplied from the third scanning line Sgc. The pixel switch SST controls connection and disconnection between the pixel circuit and the video signal line VL, and takes the video signal Vsig from the video signal line VL in the pixel circuit.

In the initialization switch IST, a source electrode is connected to the initialization line Sgi, a drain electrode is connected to the gate electrode of the drive transistor DRT, and a gate electrode is connected to the first scanning line Sga. The initialization switch IST is controlled to be on and off by a control signal IG supplied from the first scanning line Sga. The initialization switch IST controls connection and disconnection between the pixel circuit and the initialization line Sgi in response to the control signal IG. An initial potential (initialization voltage) Vini can be taken in the pixel circuit from initialization line Sgi by connecting the pixel circuit with the initialization line Sgi by the initialization switch IST.

The reset switch RST is connected between the source electrode of the drive transistor DRT and the reset line Sgr. In the reset switch RST, a gate electrode is connected to the fourth scanning line Sgd that functions as a gate line for reset control. As described above, the reset line Sgr is connected to a reset power supply and fixed to a reset potential Vrst that is a constant potential. The reset switch RST is controlled to be on and off by a control signal RG supplied from the fourth scanning line Sgd. The potential of the source electrode of the drive transistor DRT can be reset to reset potential Vrst by changing the reset switch RST to the on state.

The storage capacitor Cs is connected between the gate electrode and the source electrode of the drive transistor DRT. The auxiliary capacitor Cad is connected between the source electrode of the drive transistor DRT and the first power line SLa serving as a constant potential line.

In contrast, the panel driver 5 shown in FIG. 2 controls the scanning line drive circuits YDR1 and YDR2 and the signal line drive circuit XDR. The panel driver 5 receives a digital video signal and a synchronization signal supplied from the outside, and generates a vertical scanning control signal controlling vertical scanning timing and a horizontal scanning control signal controlling horizontal scanning timing, based on the synchronization signal.

The panel driver 5 supplies the vertical scanning control signal and the horizontal scanning control signal to the scanning line drive circuit YDR1 and YDR2 and the signal line drive circuit XDR, respectively, and supplies the digital video signal and the initialization signal to the signal line drive circuit XDR in synchronization with the horizontal and vertical scanning timing.

The signal line drive circuit XDR converts the video signals sequentially obtained in respective horizontal scanning periods under the control of the horizontal scanning control signal into an analog format, and supplies the video signals Vsig according to the gradation to a plurality of video signal lines VL. The panel driver 5 fixes the first power line SLa to the high potential Pvdd, fixes the reset line Sgr to the reset potential Vrst, and fixes the initialization line Sgi to the initialization potential Vini. Incidentally, the potential of the first power lines SLa, the potential of the reset line Sgr, and the potential of the initialization line Sgi may be set through the signal line drive circuit XDR.

A start pulse signal STV, a clock signal CKV, and the like are supplied to the scanning line drive circuits YDR1 and YDR2 by the panel driver 5.

The scanning line drive circuits YDR1 and YDR2 include shift registers, output buffers, and the like (not shown), sequentially transfer start pulse signals STV to the shift registers of the next stage, and supply four types of control signals, i.e., control signals IG, BG, SG, and RG to the sub-pixels SP of respective rows through the output buffers. The first scanning line Sga, the second scanning line Sgb, the third scanning line Sgc, and the fourth scanning line Sgd are thereby driven by the control signals IG, BG, SG, and RG, respectively.

Incidentally, the circuit configuration of the sub-pixel SP described with reference to FIG. 3 is an example, and the circuit configuration of the sub-pixel SP may be other configuration if the circuit configuration includes at least the drive transistor DRT and the light emitting element 10. For example, several elements may be omitted or other elements may be added in the circuit configuration of the sub-pixel SP described with reference to FIG. 3.

Next, the plurality of pixels PX, a plurality of lines WLa, and a plurality of resin layers 31 will be described with reference to FIG. 4.

Figure 4:
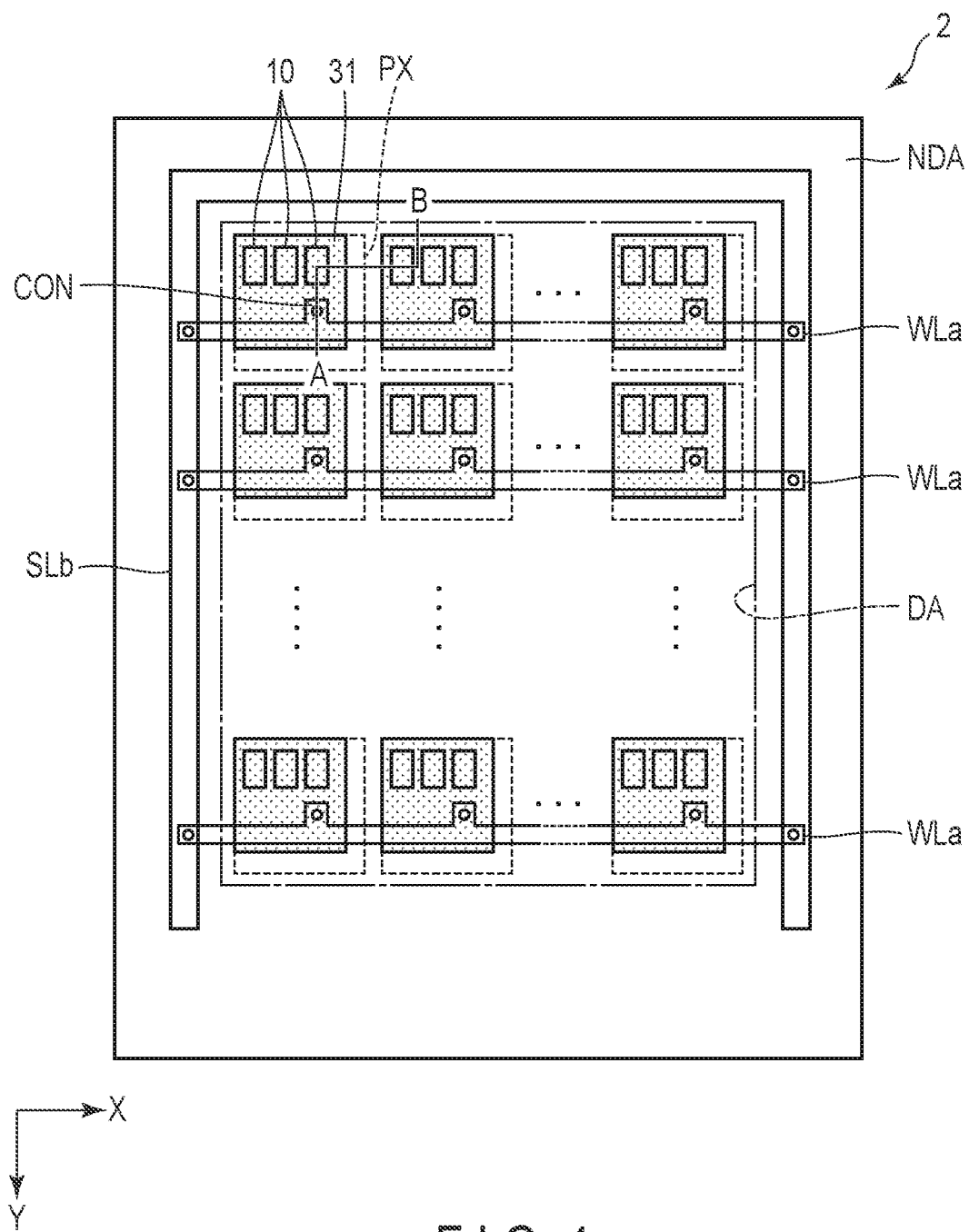
FIG. 4 is a plan view schematically showing the configuration of a display panel according to the embodiment.

As shown in FIG. 4, the second power line SLb is located in the non-display area NDA. The second power line SLb is formed in a bracket shape. The second power line SLb is provided on the upper side, the left side and the right side of the non-display area NDA, but is not provided on the lower side where the signal line drive circuit XDR is located. However, the second power line SLb may also be provided on the lower side of the non-display area NDA and may be formed to surround the display area DA on four sides.

The plurality of lines WLa are located in each of the display area DA and the non-display area NDA. The plurality of lines WLa are electrically connected to the second power line SLb in the non-display area NDA. The plurality of lines WLa extend in the first direction X, and arranged with intervals along the second direction Y, and are electrically connected to contact electrodes CON of the plurality of pixels PX arranged in the first direction X. In the embodiment, the lines WLa function as the first lines.

Incidentally, the plurality of lines WLa may extend in the second direction Y, may be arranged with intervals along the first direction X, and may be electrically connected to the contact electrodes CON of the plurality of pixels PX arranged in the second direction Y.

The plurality of pixels PX arrayed in a matrix in the display area DA comprise the plurality of light emitting elements 10, respectively. The plurality of light emitting elements 10 have mutually different luminous colors, for example, red (R), green (G), and blue (B) luminous colors.

Details of the resin layers 31 will be described later with reference to FIG. 5, and the plurality of pixels PX comprise the resin layers 31 provided in an island-like shape in one pixel unit as shown in FIG. 4, respectively. The resin layer 31 is arranged to surround the plurality of light emitting elements 10 provided in each pixel PX. The area of the resin layer 31 per one pixel in planar view is smaller than the area of one pixel (pixel PX) in planar view. As shown in FIG. 4, an area where the resin layer 31 is not provided exists between one pixel PX and a pixel PX adjacent to the pixel PX in the first direction X, and the resin layer 31 of the pixel PX is spaced apart from (not connected to) the resin layer 31 of the pixel PX adjacent to the pixel PX in the first direction X. In addition, an area where the resin layer 31 is not provided also exists between one pixel PX and a pixel PX adjacent to the pixel PX in the second direction Y, and the resin layer 31 of the pixel PX is spaced apart from (not connected to) the resin layer 31 of the pixel PX adjacent to the pixel PX in the second direction Y.

Incidentally, in FIG. 4, the example that the plurality of lines WLa extend to the positions overlaid on the resin layers 31 of the respective pixels PX, respectively, in planar view is shown, but is not limited and the plurality of lines WLa may extend to positions which are not overlaid on the resin layers 31 of the pixels PX, respectively, in planar view. However, the plurality of light emitting elements 10 are desirably provided near the lines WLa when a wiring resistance is considered.

Figure 5:
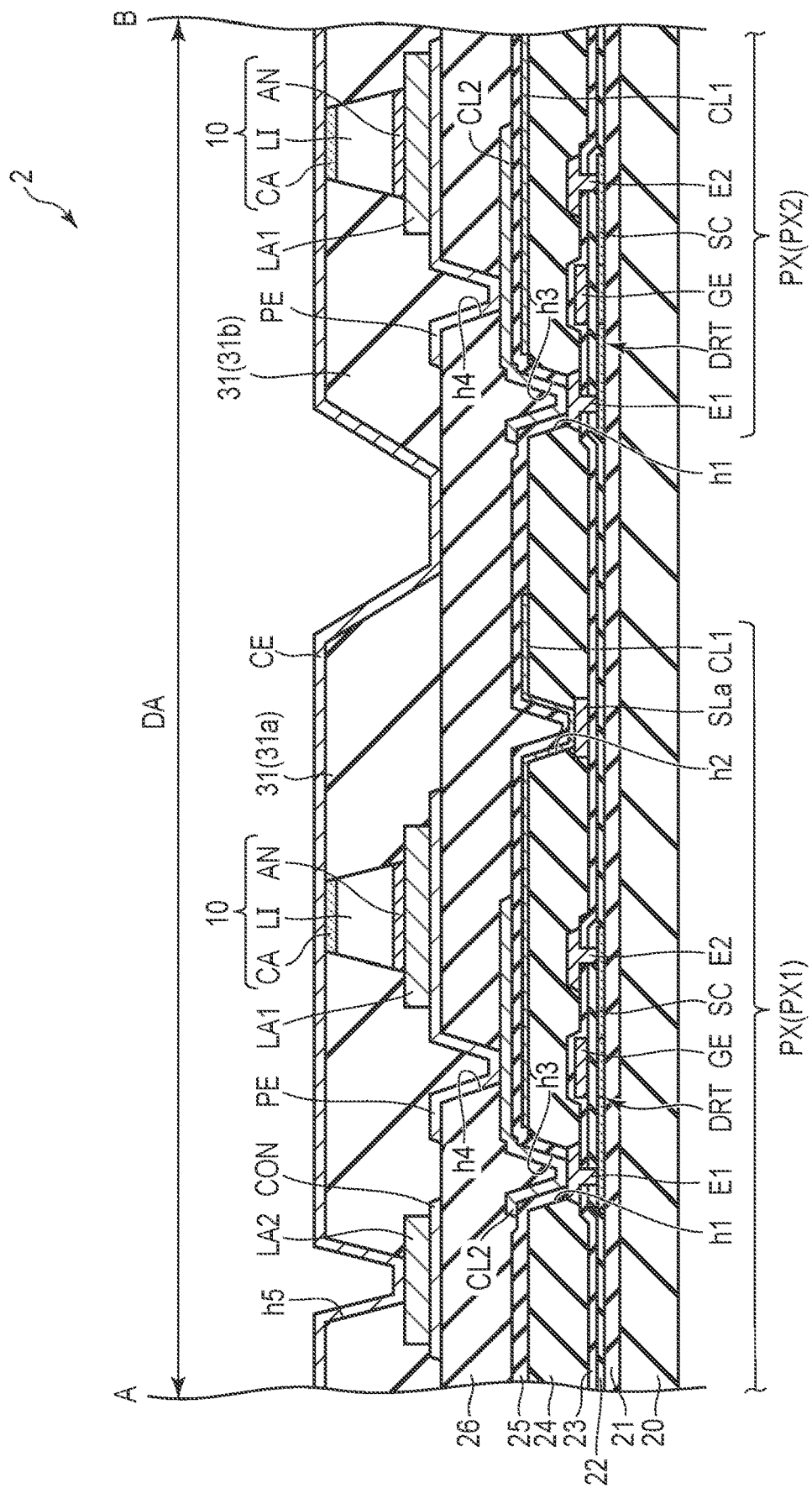
FIG. 5 is a cross-sectional view schematically showing the configuration of the display panel according to the embodiment.

FIG. 5 is a cross-sectional view schematically showing a configuration example of the display panel 2 as cut along line A-B of FIG. 4. Incidentally, in FIG. 5, the display panel 2 is drawn such that the display surface, i.e., the light emission surface faces upward and the back surface faces downward.

As shown in FIG. 5, the display panel 2 comprises the insulating base 20, insulating layers 21 to 26 provided on the insulating base 20, and the plurality of pixels PX. The plurality of pixels PX are provided on the insulating base 20, located in the display area DA, and comprise the plurality of light emitting elements 10.

A glass substrate of quartz, alkali-free glass, and the like or a resin substrate of polyimide can be mainly used as the insulating base 20. The material of the insulating base 20 is desirably a material withstanding a processing temperature in preparing the TFT. When the insulating base 20 is a flexible resin substrate, the display device 1 can be configured as a sheet display. For the resin substrate, not only polyimide, but the other resin materials may be used. Incidentally, when polyimide or the like is used for the insulating base 20, the insulating base 20 may be referred to as an organic insulating layer or a resin layer, more appropriately, in some cases.

An insulating layer 21 is provided on the insulating base 20. Various types of TFTs are formed on the insulating layer 21. In the display area DA, the drive transistor DRT is formed on the insulating layer 21. The drive transistor DRT comprises a semiconductor layer SC, a gate electrode GE, a first electrode E1, and a second electrode E2.

The semiconductor layer SC is arranged on the insulating layer 21. The insulating layer 22 is provided on the insulating layer 21 and the semiconductor layer SC. The gate electrode GE is arranged on the insulating layer 22 and is opposed to channel area of the semiconductor layer SC. The insulating layer 23 is provided on the insulating layer 22 and the gate electrode GE. The first electrode E1 and the second electrode E2 are arranged on the insulating layer 23. The first electrode E1 and the second electrode E2 are electrically connected to the semiconductor layer SC, through contact holes formed in the insulating layer 22 and the insulating layer 23, respectively. In the embodiment, the first power line SLa is further provided on the insulating layer 23.

Alternatively, the gate electrode GE is not limited to this example, but may be provided, for example, between the insulating layer 22 and the insulation base 20.

The insulating layer 24 is provided on the insulating layer 23, the first electrode E1, the second electrode E2, and the first power line SLa. The insulating layer 24 covers the drive transistor DRT. A plurality of contact holes h1 and h2 are formed in the insulating layer 24. The contact hole h1 exposes upper surface of the first electrode E1. The contact hole h2 exposes an upper surface of the first power line SLa.

A conductive layer CL1 is provided on the insulating layer 24. The conductive layer CL1 is in contact with the first power line SLa through the contact holes h2 and is electrically connected to the first power line SLa.

The insulating layer 25 is provided on the insulating layer 24 and the conductive layer CL1. The insulating layer 25 includes a contact hole h3 surrounded by the contact hole h1, and the contact hole h3 exposes the upper surface of the first electrode E1 together with the contact hole h1. A conductive layer CL2 is arranged on the insulating layer 25. The conductive layer CL2 is in contact with the first electrode E1 through the contact hole h3 formed in the insulating layer 25 and is electrically connected to the first electrode E1.

The insulating layer 26 is provided on the insulating layer 25 and the conductive layer CL2. A contact hole h4 is formed in the insulating layer 26, and the contact hole h4 exposes the upper surface of the conductive layer CL2.

The pixel electrode PE is arranged on the insulating layer 26. The pixel electrode PE is in contact with the conductive layer CL2 through the contact hole h4 formed in the insulating layer 26 and is electrically connected to the conductive layer CL2. The pixel electrode PE is electrically connected to the first electrode E1 of the drive transistor DRT via the conductive layer CL2. Signal having current value controlled is supplied from the drive transistor DRT to the pixel electrode PE.

In the embodiment, the display panel 2 includes a contact electrode CON, a connection layer LA1 and a connection layer LA2. The contact electrode CON is provided on the insulating layer 26 and is located to be spaced apart from the pixel electrode PE in an insulation distance. The connection layer LA1 is arranged on the pixel electrode PE. In planar view, the connection layer LA1 is not overlaid on the contact hole h4. The connection layer LA2 is arranged on the contact electrode CON.

The insulating layers 21 to 26 are formed of an inorganic insulating material or an organic insulating material. In the embodiment, the insulating layers 21, 22, 23, and 25 are formed of, for example, silicon oxide (SiO2) or silicon nitride (SiN) as the inorganic insulating material.

The insulating layers 24 and 26 are formed of a resin material such as a photosensitive acrylic resin. The insulating layers 24 and 26 have flat surfaces on the side opposed to the light emitting element 10, respectively, and function as planarization layers. In the embodiment, the insulating layer 24 provided above the insulating base 20 functions as the first organic insulating layer, and the insulating layer 26 provided above the insulating layer 24 functions as the second organic insulating layer.

The semiconductor layer SC is formed of low temperature polysilicon as polysilicon. However, the semiconductor layer SC may be formed of a semiconductor other than polysilicon, such as amorphous silicon or an oxide semiconductor. The gate electrode GE is formed of a metal as a conductive material. For example, the gate electrode GE is formed of molybdenum tungsten (MoW).

The first electrode E1, the second electrode E2, and the first power line SLa are located in the same layer and are formed of a metal as the same conductive material. For example, each of the first electrode E1, the second electrode E2, and the first power line SLa adopts a three-layer stacked structure (Ti-based/Al-based/Ti-based), and includes a lower layer formed of metal materials containing titanium (Ti) as a main component, such as Ti and an alloy containing Ti, an intermediate layer formed of metal materials containing aluminum (Al) as a main component, such as Al and an alloy containing Al, and an upper layer formed of metal materials containing Ti as a main component, such as Ti and an alloy containing Ti.

The switches such as the drive transistor DRT are provided above the insulating base 20 and are covered with the insulating layer 24. The example of the top-gate TFT has been described here, but the TFT may be a bottom-gate TFT.

The conductive layer CL1 is formed of a transparent conductive material such as indium tin oxide (ITO) or indium zinc oxide (IZO).

The conductive layer CL2, the pixel electrode PE and the contact electrode CON are formed of a metal as a conductive material. For example, the conductive layer CL2, the pixel electrode PE and the contact electrode CON have a two-layer stacked structure, including a lower layer formed of metal materials containing Ti as a main component such as Ti and an alloy containing Ti, and an upper layer formed of metal materials containing Al as a main component such as Al and an alloy containing Al. In the conductive layer CL2, the pixel electrode PE, and the contact electrode CON, the upper layer formed of Al or an Al alloy is an uppermost layer. For example, the uppermost layer of the contact electrode CON is located on the side opposed to the common electrode CE. The connection layer LA1 is in contact with the uppermost layer of the pixel electrode PE, and the connection layer LA2 is in contact with the uppermost layer of the contact electrode CON. The pixel electrode PE and the contact electrode CON are desirably located in the same layer and are formed of a metal as the same conductive material.

Incidentally, each of the conductive layer CL2, the pixel electrode PE, and the contact electrode CON may have the single conductive layer, the three-layer stacked structure, or the two-layer stacked structure.

In the three-layer stacked structure, the conductive layer CL2, the pixel electrode PE, and the contact electrode CON are not limited to the Ti-based/Al-based/Ti-based structure, but may be the Mo-based/Al-based/Mo-based structure. In the Mo-based/Al-based/Mo-based structure, for example, the pixel electrode PE includes a lower layer formed of metal materials containing molybdenum (Mo) as a main component such as Mo and an alloy containing Mo, an intermediate layer formed of metal materials containing Al as a main component such as Al and an alloy containing Al, and an upper layer formed of metal materials containing Mo as a main component such as Mo and an alloy containing Mo.

In the two-layer stacked structure, for example, the pixel electrode PE may include a lower layer formed of metal materials containing Mo as a main component such as Mo and an alloy containing Mo, and an upper layer formed of metal materials containing Al as a main component such as Al and an alloy containing Al. Incidentally, the conductive layer CL2 and the pixel electrode PE may be formed of a transparent conductive material.

The connection layers LA1 and LA2 are formed of solder.

In the display area DA, the light emitting element 10 is mounted above the pixel electrode PE. More specifically, the light emitting element 10 is mounted on the connection layer LA1. The light emitting element 10 includes an anode AN serving as a first polar electrode, a cathode CA serving as a second polar electrode, and an emitting layer LI emitting light. The anode AN and the cathode CA may be referred to as upper and lower electrodes as a whole. Alternatively, the anode AN may be referred to as a lower electrode, and the cathode CA may be referred to as an upper electrode.

In each light emitting element 10, the anode AN is located on a surface on the side opposed to one corresponding pixel electrode PE of the plurality of pixel electrodes PE and is electrically connected to the pixel electrode PE. In the embodiment, the anode AN is located on the connection layer LA1 and is in contact with the connection layer LA1. In each light emitting element 10, the cathode CA is located on a surface on a side opposite to the surface where the anode AN is located. In each light emitting element 10, the emitting layer LI is located between the anode AN and the cathode CA.

The resin layer 31 is provided on the insulating layer 26, the pixel electrode PE, the contact electrode CON, the connection layer LA1, the connection layer LA2, and the light emitting element 10. The resin layer 31 is buried in clearance part between the plurality of light emitting elements 10. The resin layer 31 aim to inhibit moisture and the like entering from the outside and may be referred to as sealing films. The resin layer 31 have flat surfaces on a side opposite to the side opposed to the insulating layer 26. For this reason, the resin layer 31 also functions as a planarization layer. The resin layer 31 exposes surfaces of the cathode CA of the light emitting element 10.

Incidentally, the resin layer 31 may have a thickness that does not reach the cathode CA of the light emitting element 10. Parts of unevenness caused by mounting the light emitting element 10 remain on the surface where the common electrode CE is formed, but a material forming the common electrode CE may be able to continuously cover without breakage.

The common electrode CE is located on at least the display area DA, is arranged on the insulating layers 31 and the plurality of light emitting elements 10, and covers the resin layers 31 and the plurality of light emitting elements 10. The common electrode CE is in contact with the cathodes CA of the plurality of light emitting elements 10 and are electrically connected to the cathodes CA of the plurality of light emitting elements 10. The common electrode CE is shared by the plurality of pixels PX and continuously covers the plurality of resin layers 31 provided in an island-like shape in one pixel unit.

The common electrode CE needs to be formed as a transparent electrode in order to extract the light emitted from the light emitting element 10, and is formed by using, for example, ITO as a transparent conductive material.

The common electrode CE is electrically connected to the contact electrodes CON of the plurality of pixels PX through a plurality of contact holes h5 that are formed in the plurality of resin layers 31, respectively. In the embodiment, the common electrode CE is in contact with the connection layers LA2 of the plurality of pixels PX through the plurality of contact holes h5. Since the common electrode CE is in contact with not the contact electrodes CON, but the connection layers LA2, ohmic contact can be formed between the common electrode CE and connection layers LA2.

As shown in FIG. 5, the common electrode CE is in contact with the insulating layer 26 at a position between the pixel PX1 and the pixel PX2 adjacent to the pixel PX1. That is, the resin layer 31 is not provided between the pixel PX1 and the pixel PX2 as described above. A resin layer 31a buried in clearance part between the plurality of light emitting elements 10 arranged in the pixel PX1 and a resin layer 31b buried in clearance part between the plurality of light emitting elements 10 arranged in the pixel PX2 are divided by the common electrode CE and then sealed.

Figure 6:
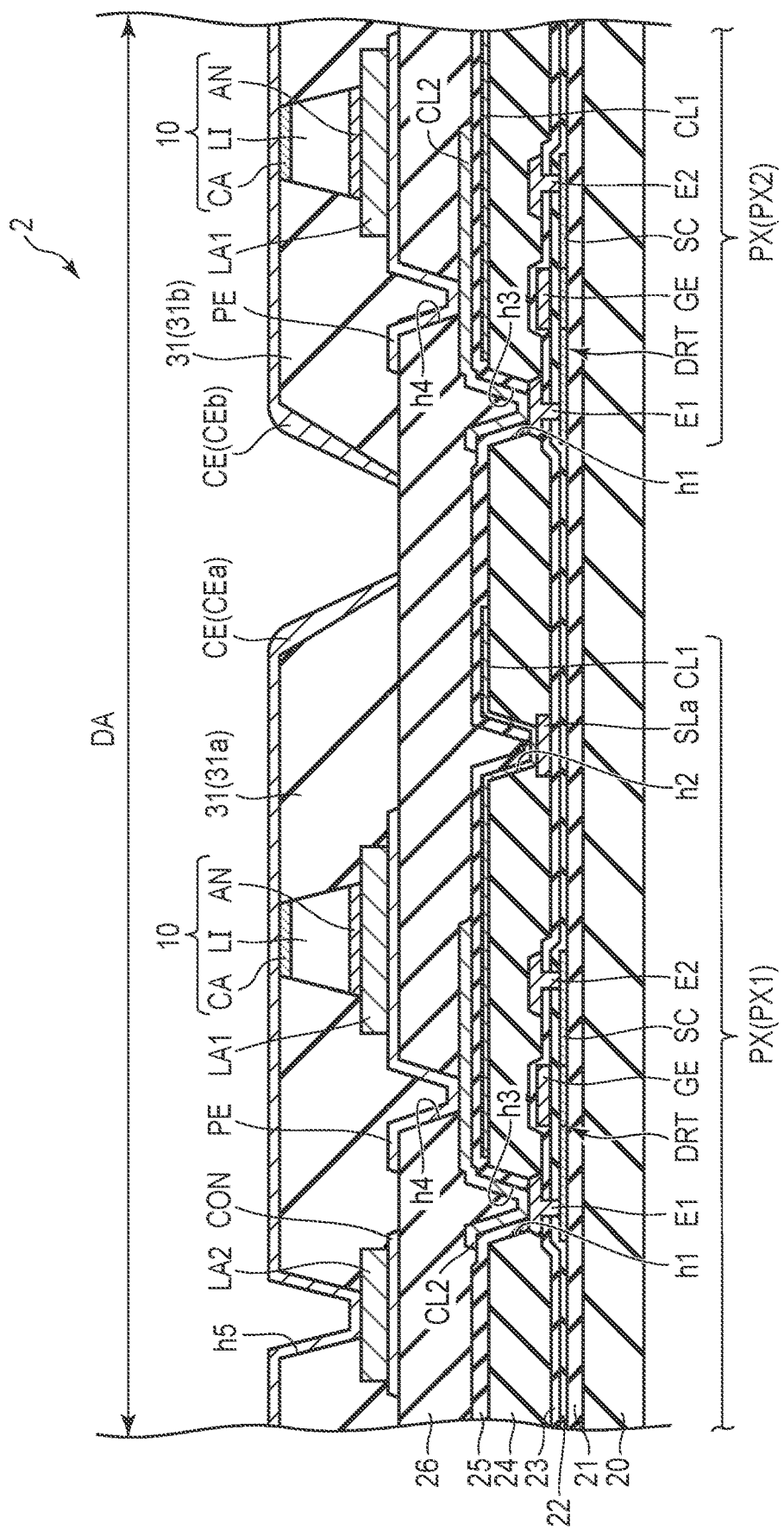
FIG. 6 is another plan view schematically showing the configuration of the display panel according to the embodiment.

Incidentally, the configuration that one common electrode CE is provided over an entire surface of the display area DA has been exemplified in FIG. 5, but, the configuration is not limited to this configuration and the common electrode CE may be provided in one pixel unit as shown in, for example, FIG. 6. That is, the common electrode CE may not be shared by the plurality of pixels PX. In this case, the resin layer 31 and the common electrode CE are not provided between the pixel PX1 and the pixel PX2. In this case, too, however, the resin layer 31a buried in the clearance part between the plurality of light emitting elements 10 arranged in the pixel PX1 and the resin layer 31b buried in the clearance part between the plurality of light emitting elements 10 arranged in the pixel PX2 are divided by common electrodes CEa and CEb provided in one pixel unit and then sealed. Incidentally, if the resin layer 31a of the pixel PX1 and the resin layer 31b of the pixel PX2 are divided, the common electrodes CEa and CEb do not need to be provided on the side surfaces of the resin layers 31a and 31b.

As described above, the display panel 2 has a structure from the insulating base 20 to the common electrode CE. Incidentally, a cover member such as a cover glass, an optical layer such as a polarizer, a touch panel, and the like may be further provided on the common electrode CE.

Figure 7:
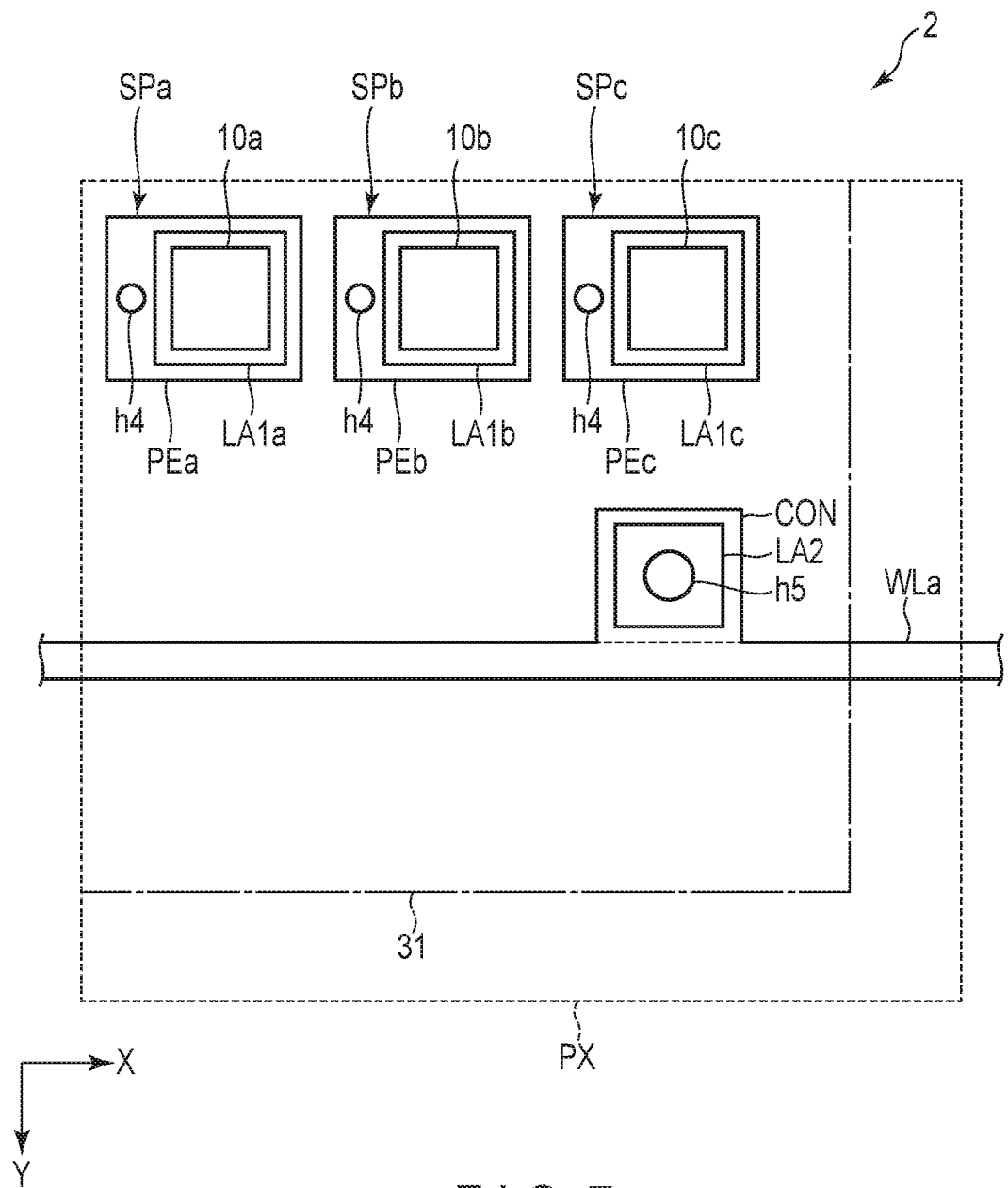
FIG. 7 is a plan view schematically showing a configuration of a pixel of the display panel according to the embodiment.

FIG. 7 is a plan view showing a pixel (pixel PX) of the display panel 2, illustrating a plurality of pixel electrodes PE corresponding to the plurality of light emitting elements 10 arranged in the pixel PX, respectively, and the plurality of connection layers LA1, the contact electrode CON, the connection layer LA2, and the line WLa.

As shown in FIG. 7, the pixel PX comprises sub-pixels SPa, SPb, and SPc. The sub-pixels SPa, SPb, and SPc are spaced apart and arranged in the first direction X. The sub-pixel SPa includes a pixel electrode PEa, a connection layer LA1a, and a light emitting element 10a. The light emitting element 10a is, for example, a red light emitting element. In addition, the sub-pixel SPb includes a pixel electrode PEb, a connection layer LA1b, and a light emitting element 10b. The light emitting element 10b is, for example, a green light emitting element. Furthermore, the sub-pixel SPc includes a pixel electrode PEc, a connection layer LA1c and a light emitting element 10c. The light emitting element 10c is, for example, a blue light emitting element.

The plurality of pixel electrodes PEa, PEb, and PEc, the contact electrode CON, and the line WLa are provided between the insulating layer 26 and the resin layer 31, i.e., provided in the same layer, and are formed of the same metal. In the embodiment, the line WLa is formed integrally with a plurality of contact electrodes CON arranged in the first direction X.

The plurality of pixel electrodes PEa, PEb, and PEc are electrically connected to the conductive layer CL2 located below the insulating layer 26, through a plurality of contact holes h4 formed in the insulating layer 26. The common electrode CE located above the resin layer 31 is in contact with the connection layer LA2 through the contact hole h5 formed in the resin layer 31.

An interval between two sub-pixels SP adjacent in the first direction X is, for example, shorter than the length in the first direction X of the area where the resin layer 31 is not provided.

Advantages of the display device 1 (display panel 2) according to the embodiment will be described with reference to a comparative example. Incidentally, the comparative example is intended to describe parts of the advantages that can be achieved by the display device 1 (display panel 2) according to the embodiment and do not exclude advantages common to the comparative example and the embodiment from the scope of the present invention.

Figure 8:
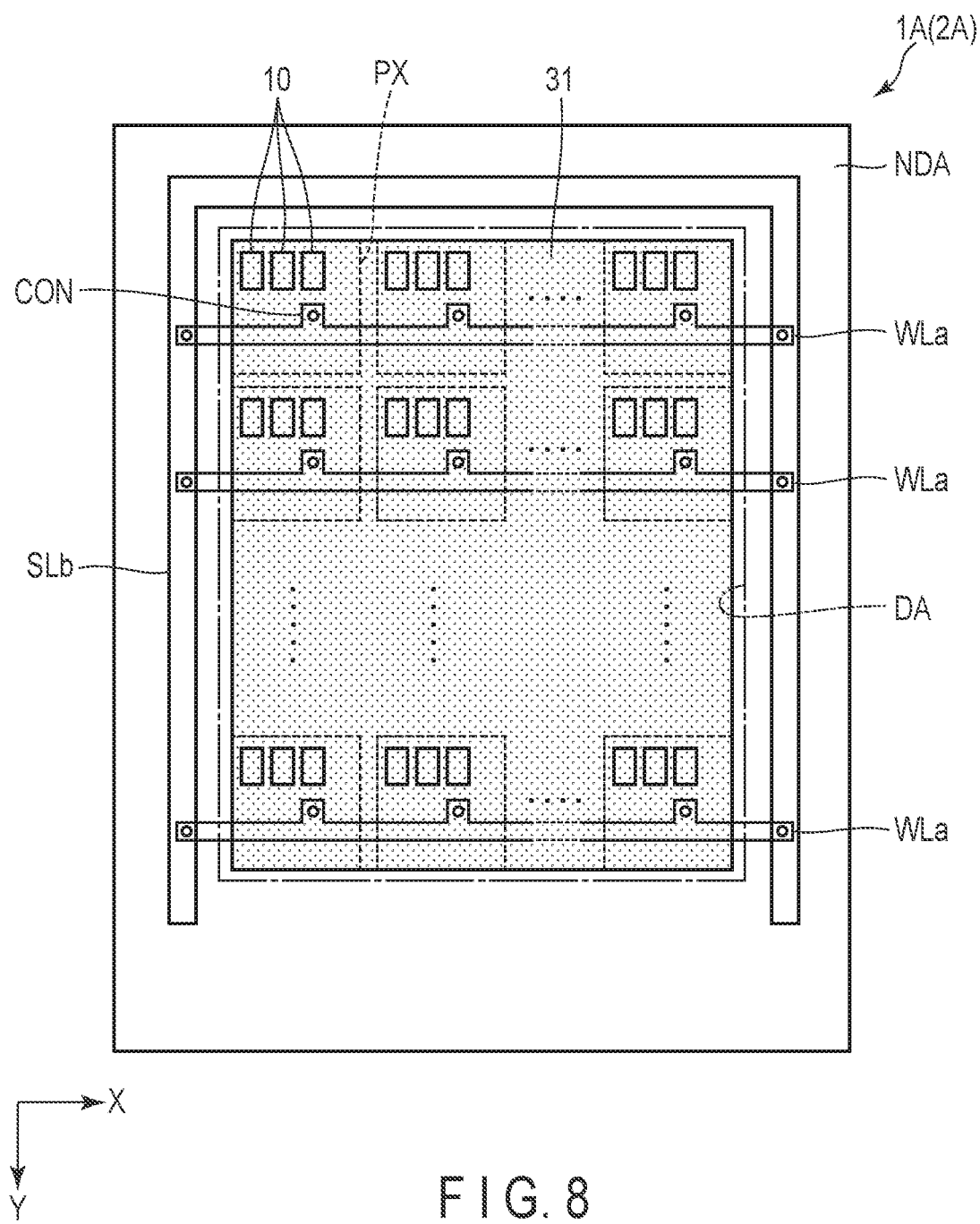
FIG. 8 is a plan view schematically showing a configuration of a display panel according to a comparative example.
Figure 9:
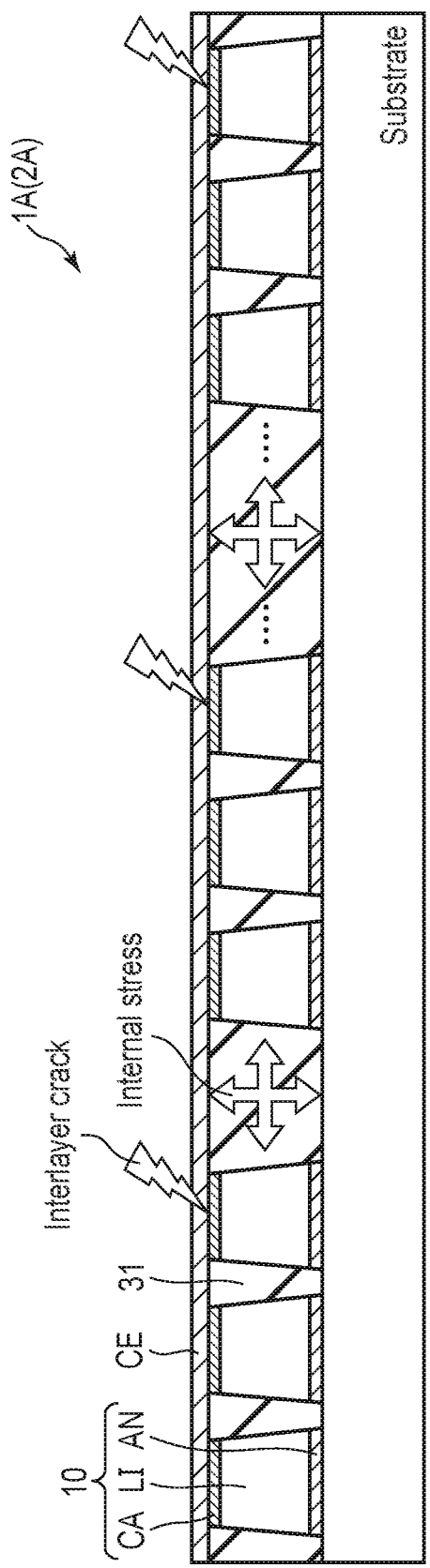
FIG. 9 is a cross-sectional view schematically showing the configuration of the display panel according to the comparative example.
Figure 10:
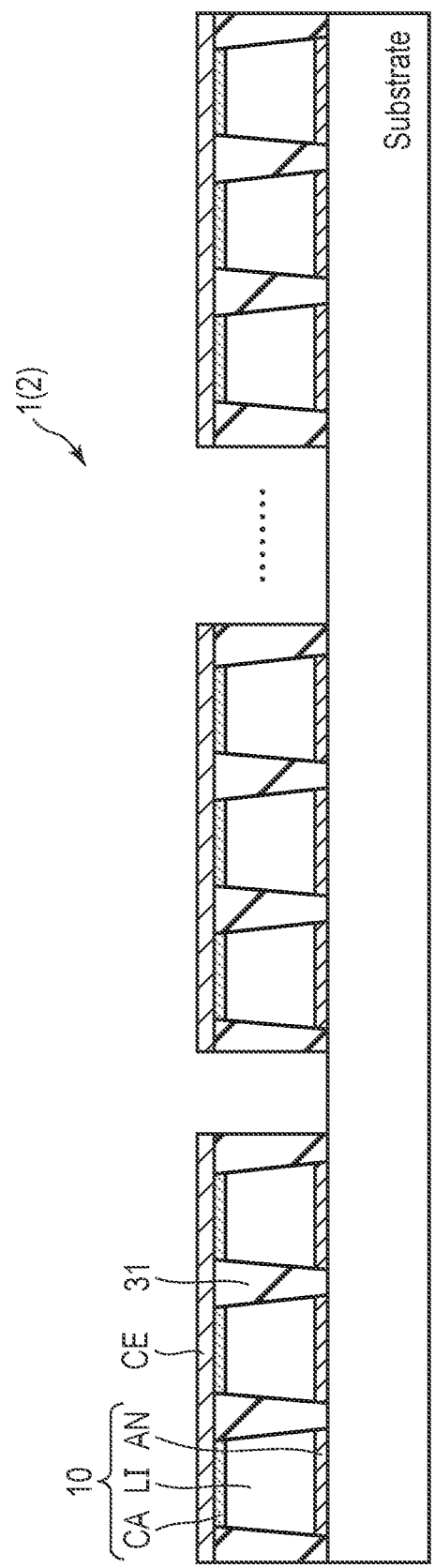
FIG. 10 is another cross-sectional view schematically showing a configuration of the display panel according to the embodiment.

FIG. 8 is a plan view showing the display device 1A (display panel 2A) according to a comparative example, and FIG. 9 is a cross-sectional view showing the display device 1A (display panel 2A) according to the comparative example. In contrast, FIG. 10 is a cross-sectional view showing the display device 1 (display panel 2) according to the embodiment. Incidentally, FIG. 10 is the view simplifying FIG. 5 and omits elements unnecessary to describe differences from the comparative example. As shown in FIG. 8 and FIG. 9, the display device 1A (display panel 2A) according to the comparative example is different from the embodiment with respect to a feature that the resin layer 31 is provided over the entire surface of the display area DA.

In general, the organic insulating material forming the resin layer 31 has the characteristics that the linear expansion coefficient is large and the material can easily be thermally contracted. For this reason, an internal stress resulting from the thermal contraction is applied to the coherent interface between the resin layer 31 and the common electrode CE. When the internal stress is applied to the coherent interface between the resin layer 31 and the common electrode CE, there is a risk that the common electrode CE may be peeled off from the resin layer 31. When the common electrode CE is peeled off from the resin layer 31, the common electrode CE may also be peeled off from the cathode CA of the light emitting element 10. When the common electrode CE is peeled off from the cathode CA of the light emitting element 10, a problem arises that a drive current cannot be supplied to the light emitting element 10 since the common electrode CE and the light emitting element 10 are not electrically connected to each other. In contrast, there is a problem that when the resin layer 31 cannot be provided in the clearance part between the plurality of light emitting elements 10, entry of moisture and the like from the outside cannot be inhibited.

According to the configuration of the display panel 2 according to the embodiment, the above-described internal stress can be scattered in one pixel unit since the resin layer 31 is provided in an island-like shape in each pixel PX and the resin layer 31 is not provided between two adjacent pixels PX as shown in FIG. 10. For this reason, the common electrode CE being peeled off from the resin layer 31 can be inhibited, and the common electrode CE being peeled off from the cathode CA of the light emitting element 10 can be further inhibited (interlayer crack can be inhibited). According to this, reliability of the connection between the common electrode CE and the cathode CA of the light emitting element 10 can be improved, and the display device 1 capable of inhibiting breakage resulting from the component can be obtained.

In addition, the common electrode CE is electrically connected to the contact electrode CON in each pixel, in the configuration according to the embodiment. The contact electrode CON is electrically connected to the line WLa formed of a metal. For this reason, wiring resistance between the light emitting element 10 and the second power line SLb can be reduced as compared with a case where the common electrode CE is in contact with the second power line SLb in the non-display area NDA. According to this, the display device 1 capable of improving high definition can be obtained. Alternatively, the display device 1 capable of attempting to reduce the power consumption can be obtained. Alternatively, the display device 1 capable of improving high definition and attempting to reduce the power consumption can be obtained.

Incidentally, in the embodiment, the configuration that the resin layer 31 is provided in an island-like shape in one pixel unit has been described. However, the embodiment is not limited to this configuration, but, for example, the resin layer 31 may be provided in an island-like shape in a unit of several pixels. In this case, too, since the above-described internal stress can be dispersed in a unit of several pixels, the common electrode CE being peeled off from the resin layer 31 can be inhibited and then the common electrode CE being peeled off from the cathode CA of the light emitting element 10 can be inhibited as compared with the configuration according to the comparative example.

Incidentally, it has been described that the resin layer 31 has an island-like shape and is not provided between two adjacent pixels PX in the embodiment has been described. However, the resin layer 31 may be formed to be left thinly between two adjacent pixels PX. In this case, for example, the resin layer 31 formed in an island-like shape is connected with the resin layer 31 formed in an island-like shape in a different pixel PX by the thinly formed resin layer 31. For example, in the example shown in FIG. 4, a part of the line WLa is exposed from the resin layer 31 at a position between two adjacent pixels PX but, to protect the line WLa from an external environment, the line WLa can be covered with the thinly formed resin layer 31 so as not to be exposed from the resin layer 31. The thinly formed resin layer 31 means, for example, being thinner than the thickness of the resin layers 31 having an island-like shape in the pixels PX, and is desirably considered to have a thickness smaller than or equal to a half of the thickness of the resin layers 31 having an island-like shape. For this reason, even in a case where the thin resin layer 31 is formed between two adjacent pixels PX, the resin layers 31 formed in the pixels PX are considered to be formed in an island-like shape.

Figure 11:
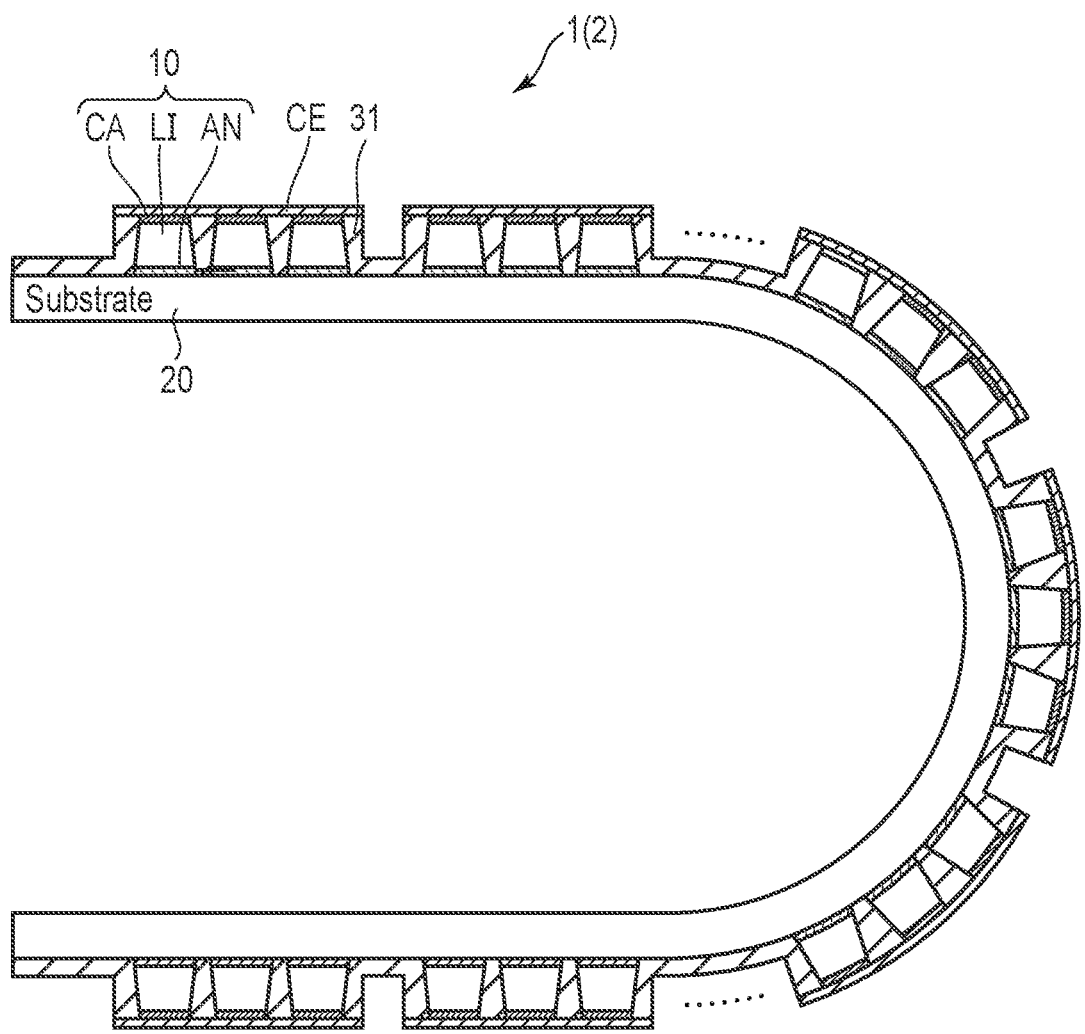
FIG. 11 is yet another cross-sectional view schematically showing the configuration of the display panel according to the embodiment.

Furthermore, the structure according to the embodiment exerts a special advantage in a flexible display device as shown in FIG. 11 as well as dispersion of the internal stress of the resin layer 31 shown in FIG. 10. In FIG. 11, the insulating base 20 is a flexible resin substrate 20 having a flexibility, and the display device 1 is a bendable flexible display device 1. As shown in FIG. 11, the resin layers 31 formed in an island-like shape in the respective pixels PX are coupled by the resin layer 31 formed to be thin. This resin layer may be left for protection of the lines WLa as described above, or may be provided to specifically protect curved parts to which stress can easily be applied. Naturally, to improve the flexibility, a structure that the resin layer 31 is not formed between two adjacent pixels PX may be adopted. According to the structure of FIG. 11, the flexibility (flexible property) of the flexible display device 1 can be further improved as compared with the structure in which the resin layer 31 of FIG. 8 and FIG. 9 is formed on the front side.

According to the above-described embodiment, the micro-LED display (display device) capable of inhibiting the breakage resulting from the component can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
   a substrate; and
   a plurality of pixels arranged on the substrate, wherein
   each of the plurality of pixels comprise a plurality of light emitting elements luminous different colors, respectively,
   a resin layer is arranged in a clearance part between the plurality of light emitting elements provided in each of the pixels,
   a common electrode formed of a transparent conductive material covers the resin layer and the plurality of light emitting elements in a pixel,
   a pixel electrode is formed separately in each of the light emitting elements,
   the resin layer is provided separately in each of the pixels and is not formed between two adjacent pixels,
   the plurality of light emitting elements are micro-LEDs each comprising an emitting layer that emits light, upper electrode and lower electrode, the resin layer is arranged on the plurality of light emitting elements and exposes the upper electrode, the upper electrode contacts the common electrode, and the lower electrode contacts the pixel electrode via a connection layer.

2. The display device of claim 1, wherein area of the resin layer per one pixel in planar view is smaller than area of the one pixel in planar view.

3. The display device of claim 2, wherein the common electrode continuously covers a plurality of resin layers that are provided in the respective pixels.

4. The display device of claim 3, wherein the common electrode is electrically connected to the upper electrode of each of the light emitting elements.

5. The display device of claim 4, wherein the common electrode is electrically connected to a contact electrode provided in each of the pixels, though a contact hole formed in the resin layer.

6. The display device of claim 5, wherein the substrate comprises a first line electrically connected to the contact electrode provided in each of the pixels, and the first line extends to a position overlaid on the resin layer in planar view.

7. The display device of claim 5, wherein the common electrode is electrically connected to the contact electrode provided in each of the pixels, the substrate comprises a first line electrically connected to the contact electrode provided in each of the pixels, and the first line extends to a position that is not overlaid on the resin layer in planar view.

8. The display device of claim 2, wherein the common electrode is provided separately in each of the pixels but is not provided between two adjacent pixels.

9. The display device of claim 8, wherein the common electrode is electrically connected to the upper electrode of each of the light emitting elements.

10. The display device of claim 9, wherein the common electrode is electrically connected to a contact electrode provided in each of the pixels, though a contact hole formed in the resin layer.

11. The display device of claim 10, wherein the substrate comprises a first line electrically connected to the contact electrode provided in each of the pixels, and the first line extends to a position overlaid on the resin layer in planar view.

12. The display device of claim 10, wherein the common electrode is electrically connected to the contact electrode provided in each of the pixels, the substrate comprises a first line electrically connected to the contact electrode provided in each of the pixels, and the first line extends to a position that is not overlaid on the resin layer in planar view.

* * * * *